United States Patent [19]

Blanchard

[11] Patent Number: 4,983,535
[45] Date of Patent: Jan. 8, 1991

[54] VERTICAL DMOS TRANSISTOR FABRICATION PROCESS

[75] Inventor: Richard A. Blanchard, Los Altos, Calif.

[73] Assignee: Siliconix Incorporated, Santa Clara, Calif.

[21] Appl. No.: 292,668

[22] Filed: Dec. 28, 1988

Related U.S. Application Data

[63] Continuation of Ser. No. 109,388, Oct. 15, 1981, abandoned.

[51] Int. Cl.$^5$ .......................................... H01L 21/335
[52] U.S. Cl. .......................................... 437/40; 437/29; 437/38; 437/41; 437/179; 437/192; 437/201; 437/203; 437/44; 148/DIG. 105; 148/DIG. 126; 357/23.4
[58] Field of Search .................. 357/23.4, 23.1, 15; 437/178, 179, 38, 41, 52, 203, 29, 40, 44, 192, 201; 148/DIG. 105, DIG. 126

[56] References Cited

U.S. PATENT DOCUMENTS

| | | | |
|---|---|---|---|
| 3,412,297 | 11/1968 | Amlinger | 317/235 |
| 4,295,267 | 10/1981 | Harrington et al. | 437/228 |
| 4,324,038 | 4/1982 | Chang et al. | 437/178 |
| 4,344,081 | 8/1982 | Pao et al. | 357/43 |
| 4,345,265 | 8/1982 | Blanchard | 357/23 |
| 4,375,124 | 3/1983 | Cogan | 437/162 |
| 4,383,885 | 5/1983 | Maydan et al. | 156/657 |
| 4,443,931 | 4/1984 | Baliga et al. | 437/152 |
| 4,520,552 | 6/1985 | Arnould et al. | 437/203 |
| 4,546,367 | 10/1985 | Schutten et al. | 357/23.4 |
| 4,675,713 | 6/1987 | Terry et al. | 357/23.1 |

FOREIGN PATENT DOCUMENTS 0058267 5/1981 Japan.
0003287 1/1983 Japan.

OTHER PUBLICATIONS

N. E. Miller, I. Being Glass, *Solid State Technology*, Dec. 1982, pp. 85–90.
Y. Pauleau, "Interconnect Materials for VLSI Circuits", *Solid State Technology*, Apr. 1987, pp. 155–162.

*Primary Examiner*—Brian E. Hearn
*Assistant Examiner*—T. N. Quach
*Attorney, Agent, or Firm*—Skjerven, Morrill MacPherson, Franklin & Friel

[57] ABSTRACT

A process for fabricating a vertical DMOS transistor is set forth. The starting material is a heavily doped silicon wafer which has an epitaxial layer thereon. A DMOS body region is diffused into the epitaxial layer and a deep body contact region created. The source is a refractory metal Schottky barrier located on top of the body region. A trench is etched into the epitaxial layer so as to fully penetrate the body region and the trench surfaces oxidized to form a gate oxide. The trench is then filled with doped polysilicon to create a gate electrode. The resulting DMOS has a relatively short channel and the parallel bipolar parasitic transistor cannot be turned on.

5 Claims, 3 Drawing Sheets

VERTICAL DMOS TRANSISTOR FABRICATION PROCESS

This application is a continuation of application Ser. No 07/109,388, filed Oct. 15, 1987 now abandoned.

CROSS-REFERENCE TO RELATED APPLICATIONS

This application is related to U.S. Pat. Application Ser. No. 06/843,454, filed Mar. 24, 1986 by this inventor, now U.S. Pat. No. 4,767,722, entitled, "A Planar, Vertical Channel DMOS Structure".

BACKGROUND OF THE INVENTION

1. Field of the Invention

The invention relates to the construction of a vertical diffused metal oxide semiconductor (DMOS) transistor structure and more particularly relates to the avoidance of parasitic elements in such structures. DMOS transistors have been developed to supplement the well-known planar insulated gate field effect transistor (IGFET) structures. U.S. Amlinger Pat. No. 3,412,297 discloses a vertical DMOS transistor having a channel length of less than a micron. The teaching in this patent is incorporated herein by reference. The basic structure is a high frequency NPN transistor having a base about 0.5 micron thick. This NPN structure is etched to expose the edges of the various layers and a gate oxide is grown over the exposed edges. When a gate metal is formed over the gate oxide it confronts the edge of the thin base. Then when the structure is biased the gate metal potential will act to modulate the current flowing across the edge of the thin base P region. Since the P region is typically only about one-half micron thick the resulting DMOS will have a channel length of less than a micron. While not shown in the patent, the NPN transistor will act in parallel with the DMOS and thereby create a parasitic parallel-connected bipolar transistor that can be biased into conduction. Such conduction is localized and can result in localized heating which in turn results in greater conduction. This behavior can be a regenerative and destructive process.

2. Description of the Prior Art

The Amlinger patent shows a prior art version of a vertical DMOS transistor that employs a metal gate electrode. The invention makes use of a silicon gate which is created by trench etching and a conductive polycrystalline silicon (polysilicon) backfill. FIG. 1 shows a silicon gate vertical DMOS transistor which makes use of trench etching. While Amlinger shows a broad trench etched into a vertical NPN transistor, FIG. 1 show a narrow, sharply defined, trench etched within the confines of the NPN transistor emitter and made deep enough to fully penetrate the base region. Thus, the emitter surrounds the trench.

In FIG. 1, the semiconductor starting wafer is an N+ substrate 10 having grown thereon an epitaxial N type layer 11. Layer 11 has diffused therein a heavily doped P+ transistor base contact region 12 and a central P type base region 13. Base contact region 12 is normally made in the form of a peripheral ring that is shaped to provide the desired transistor topography. Emitter N+ diffused region 14 is located within base region 13 and extends only part way therethrough. A trench is etched through the resultant NPN transistor in the center of the emitter and the etching is extended so as to fully penetrate the base region 13. The trench walls are oxidized to create gate oxide 15 and it is filled with conductive polysilicon 16 which forms the DMOS transistor gate. Contact metal 17, which is applied over the silicon surface, shorts regions 14 and 12 together to provide the source electrode. It can be seen that region 13 forms the DMOS transistor channel region which can be rendered conductive where it abuts the gate oxide 15 by the potential applied to the gate 16. When the gate potential is made sufficiently positive with respect to metal layer 17 (the DMOS body contact) an adjacent N type channel can be created to pass electrons from source 14 to drain 11.

As will be seen in the subsequent discussion, the structure of FIG. 1 can be constructed using well-known processing steps. However, it has a serious drawback. The vertical DMOS transistor is connected in parallel with an NPN bipolar transistor. Since this parasitic NPN transistor has is emitter connected to its base by metal 17 it cannot normally be turned on. However, it can be seen that the inner confines of region 13 are some distance away from region 12 and this establishes a lateral resistance. If sufficient base current is caused to flow laterally, for example due to a drain transient, the NPN bipolar transistor can be momentarily turned on by the voltage drop that exists across the base resistance. Once such conduction starts it can locally heat the silicon and create a runaway condition that will grow and destroy the transistor. This phenomenon is well-known in bipolar power transistors which are typically ballasted to avoid the problem.

SUMMARY OF THE INVENTION

It is an object of the invention to provide a process for making a vertical DMOS transistor structure in a silicon substrate.

It is a further object of the invention to provide a vertical DMOS fabrication process in which the associated parasitic bipolar transistor cannot be turned on.

These and other objects are achieved as follows. The starting material is an N+ substrate wafer having an epitaxial layer thereon. The epitaxial layer has a resistivity suitable for a DMOS drain. A masking oxide is grown or deposited over the wafer. A first photolithographic etch is made in the oxide layer and a deep P+ type diffusion creates a deep body contact region. A second photolithographic etch is made in the oxide to remove it between the deep P+ diffusion confines. Then a P-type body region is diffused into the silicon and at the same time the oxide is regrown. A third photolithographic cut is made to remove the regrown oxide over the P-type body region except for a centrally disposed area where the gate is to be established. Then, using a catalytic deposition step, a refractory metal is deposited where the oxide was removed in the previous step. The metal does not deposit where the oxide remains on the silicon. This refractory metal makes a Schottky barrier contact over the P diffused region. This metal becomes the DMOS source electrode. Then the oxide left in the centrally disposed area is removed and an anisotropic etch employed to cut a trench into the silicon. In this etching step, the deposited metal acts as a mask. The trench is made deep enough to cut completely through the P diffused region. The walls of the trench are then oxidized to create a gate oxide and conductive polysilicon deposited over the wafer so as to fill the trench. The polysilicon is made conductive by doping it either during or following deposition. The polysilicon is etched to remove it except for the material in the trench. The surface of the remaining polysilicon is then oxidized thereby creating a polysilicon gate electrode, spaced from the P diffused material surrounding the trench by the thickness of the gate oxide. Not shown in FIGS. 1–9 is the contact to the gate conductor, which is made out of the plane of these drawings. A contact opening is then created in the polysilicon gate, contact region, and the P+ deep body region, and a layer of conventional aluminum metallization is deposited. This metal is photolithographically contoured to provide electrical contact to the gate, contact region, the P+ deep body, and to the refractory metal layer which constitutes the source electrode. The N+ starting wafer on the opposite wafer face constitutes the device drain contact.

Since the deep P+ contact region is directly connected to the source electrode by the top surface metallization, the Schottky source, the deep P+ and the P-type body are at the same potential. The parasitic bipolar transistor cannot be turned on since the Schottky source is a poor emitter of electrons. Therefore the parasitic effects of the bipolar transistor are eliminated. It will be noted that the structure is created using only five photolithographic masks.

The various drawing figures illustrate a fragment of a semiconductor wafer. The dimensions are not to scale. The vertical dimensions are exaggerated for clarity.

DESCRIPTION OF THE PREFERRED EMBODIMENT

Figure 2:
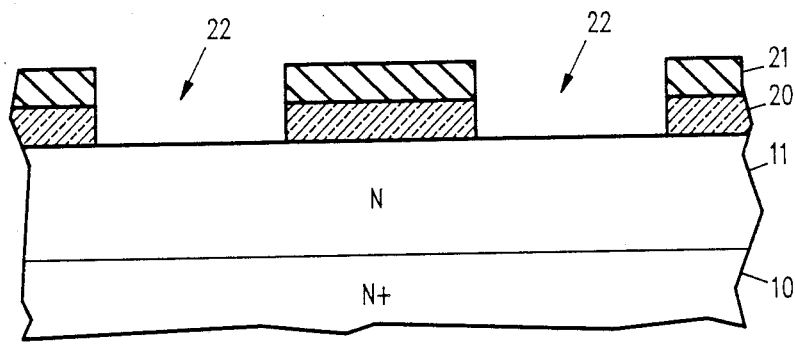
FIGS. 2–8 comprise the steps in the process of the invention for achieving the vertical DMOS transistor.
Figure 3:
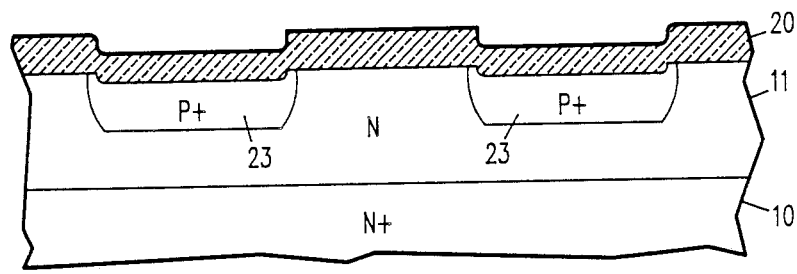

As shown in FIG. 2 the starting material is an N+ type silicon wafer 10 which has an N type epitaxial layer 11 grown thereon. The epitaxial layer is grown conventionally and its resistivity is selected to provide the desired device properties. Typically, this layer will be about 8–60 microns thick and have a resistivity of about 0.5–50 ohm centimeters. A masking oxide 20 is either grown or deposited on top of the epitaxial layer. Typically, oxide layer 20 is about 0.4–1.0 micron thick.

A photolithographic mask is used to create a hole 22 in oxide 20. A layer of photoresist 21 is applied over the wafer and the first photo mask used to create the hole in the photoresist using the conventional optical exposure and chemical development. Then the oxide is etched within the hole to expose the silicon surface inside hole 22 as shown. The resist is then removed and a heavily doped P+ region 23 is diffused into epitaxial layer 11. During this diffusion the oxide is regrown inside hole 22 and this produces a slight etching or depression of the silicon surface. Region 23 will have a typical sheet resistance, after processing is completed, of about 40–160 ohms per square. The deep P+ contact region 23 defines the topography and the lateral confines of the ultimate DMOS transistor.

Figure 4:
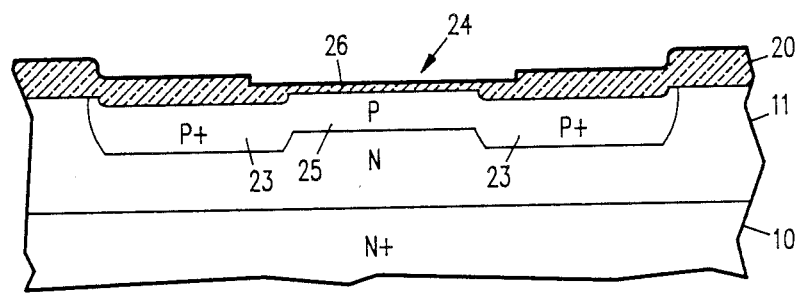

A second photolithographic mask is employed to form a hole 24 in oxide 20 as shown in FIG. 4. This hole has an outer periphery that is inside that of the first mask. This hole masks a second P-type diffusion which is designed to create body region 25. Region 25 has a typical sheet resistance of about 100–1000 ohms per square which is selected to provide the desired DMOS device channel characteristics. During the diffusion of region 25 the oxide layer is regrown as shown at 26.

Figure 5:
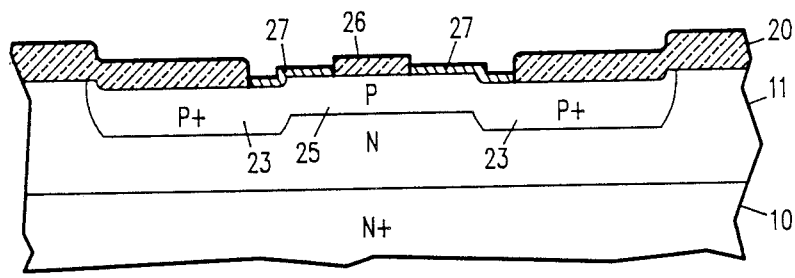

A third photolithographic mask is then employed to remove oxide layer 26 inside hole 24 except for a small central region centered within region 25. A metal layer 27 is deposited on the silicon surface as shown in FIG. 5. This metal is a refractory metal such as tungsten applied by a selective deposition process. While tungsten is the preferred refractory metal, other metals such as molybdenum, titanium, thorium, rubidium, platinum, osmium or iridium could be used. The process is catalytic so that the metal is deposited only on the exposed silicon. Where the oxide is present deposition is not catalyzed and no metal is deposited. This metal is selected to form a suitable Schottky barrier with the silicon. As such it serves as a source of electrons for the DMOS device, but has a low electron injection efficiency into the highly doped body region, forming a bipolar transistor (NPN) with a gain less than one.

Figure 6:
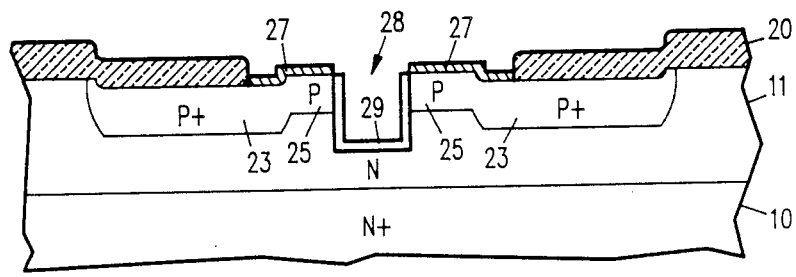

Then using refractory metal layer 27 as an etch mask, the remnant of oxide 26 is removed and a trench (or groove) etched into the silicon at 28 as shown in FIG. 6. This trench is confined inside region 25. It is located and shaped to define the DMOS transistor gate. The trench at 28 has straight walls and is created with an anisotropic etch using the well-known reactive ion etching (RIE) technique. The etching is continued until region 25 is completely penetrated as shown in FIG. 6. Typically, the trench is 2–4 microns deep and 0.8–1.5 microns wide.

The wafer is then subjected to thermal oxidation and a gate oxide 29 is grown on the exposed silicon. The gate oxide is typically about 500–1000Å thick. During trench formation metal layer 27 will mask the upper surfaces of regions 23 and 25 while oxide 20 masks the rest of the wafer surface.

Figure 7:
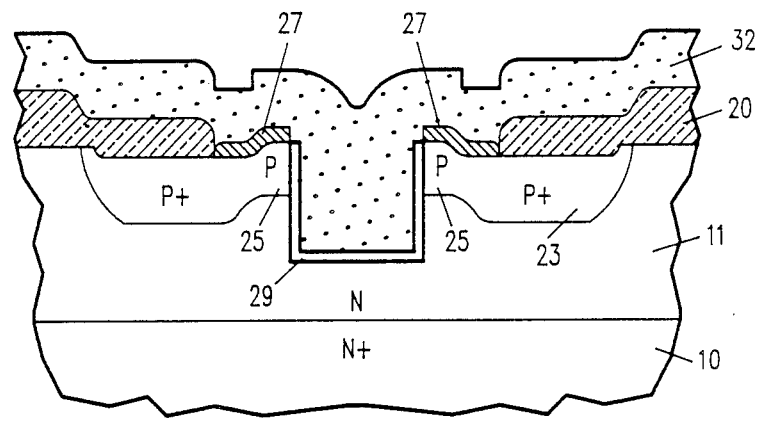

Then, as shown in FIG. 7, a layer of polysilicon 32 is deposited over the wafer. This layer is doped to render it conductive either during or after deposition. Layer 32 is typically 0.4–0.8 microns thick and is designed to completely fill the trench as shown.

Figure 8:
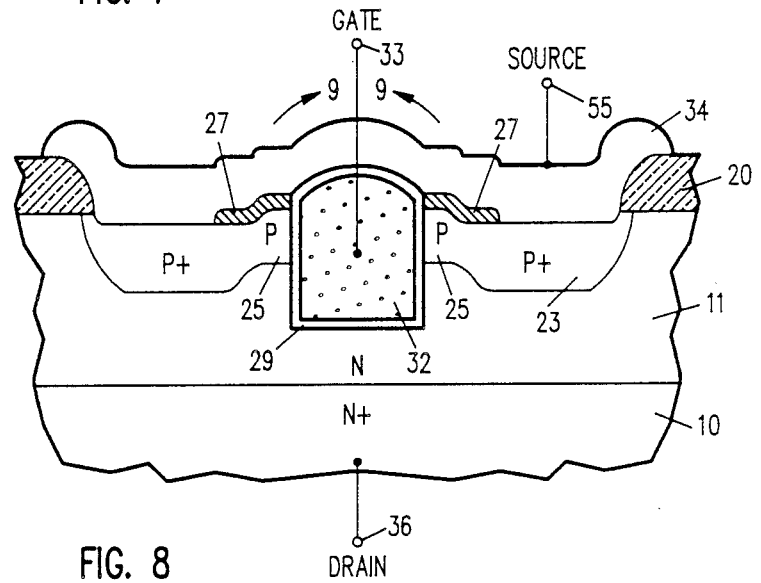

Polysilicon 32 is then etched so as to remove it except for that portion inside the trench (see FIG. 8). Then the exposed surface of polysilicon 32 is oxidized so that it forms an insulating layer over the conductive plug facing oxide layer 29. Thus, the remaining plug of polysilicon forms the insulated DMOS gate electrode. A connection thereto is shown schematically at 33, but is made out of the plane of the drawings. This connection requires a fourth photomask to etch a hole in the oxide over the extension of the gate polycrystalline silicon while the contact to the deep P+ region is being opened.

A conventional metallization layer 34 is applied over the wafer and etched back, using a fifth photolithographic mask, as shown in FIG. 8. This makes an electrode contact to refractory metal layer 27 and to deep P+ regions 23 and thereby forms source contact 35 which is shown schematically. N+ wafer 10 forms the DMOS drain contact shown schematically at 36.

While not shown, the entire structure can be overcoated with passivation and/or sealing layers that may include layers of silicon nitride or phosphorous doped silicon dioxide glass (PSG).

Figure 9:
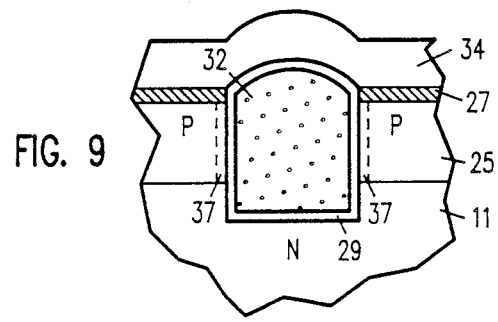
FIG. 9 is an enlarged showing of the gate region of the FIG. 8 structure.

FIG. 9 is an enlarged view of the central portion of FIG. 8. It can be seen that source metal layer 27 is in contact with P type region 25 and this creates a Schottky barrier electrode. Such an electrode does not inject electrons into the P-type body, but serves as a source of carriers for the DMOS transistor. It will be noted that metal layer 27 is ohmically connected to region 23 and shorts out the surface of region 25. When drain electrode 36 is connected to the positive terminal of a power supply the PN junction between regions 11 and 25 will be reverse biased and a very small current (junction leakage) will flow. However, when gate terminal 33 is positively biased it will tend to invert the adjacent portion 37 of region 25, as shown by the dashed line. When such an N type channel 37 is created, electrons injected by the Schottky source 27 will flow through the channel and be collected at drain 11. Thus, a DMOS structure is present in which gate electrode 33 will control the flow of current between source 27 and drain 11. When the gate is zero biased the device will be off and it is therefore an enhancement-type DMOS.

The structure of FIGS. 8 and 9 is preferred primarily because of the Schottky barrier source. The parasitic NPN transistor that parallels the DMOS has very low current gain because its emitter is not capable of injecting minority carriers into the base and the bipolar NPN transistor cannot conduct appreciably.

While the preferred embodiment is shown as an N channel device the various semiconductor conductivity types can be complemented to create a P channel DMOS transistor. In such a structure the bias potentials would be reversed. Otherwise, the complementary device would function in a similar manner.

Figure 1:
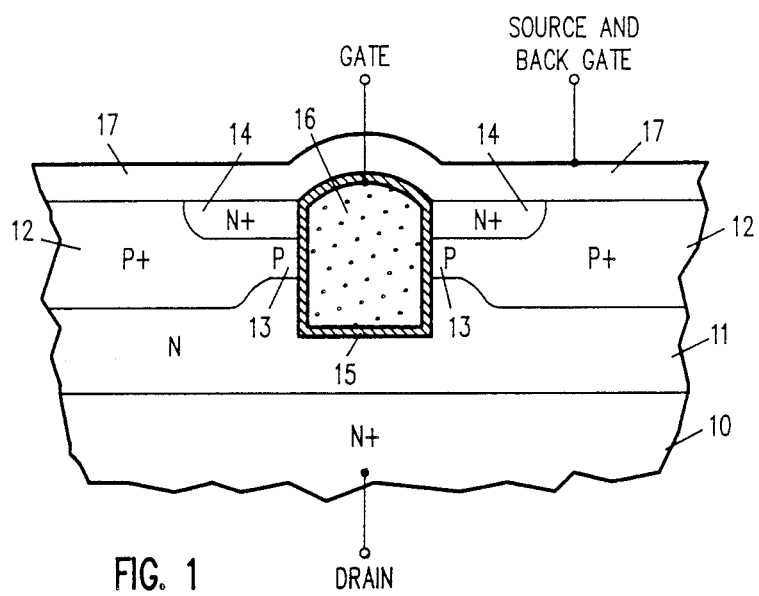
FIG. 1 shows a cross-section of a previously disclosed version of a vertical DMOS transistor.
Figure 10:
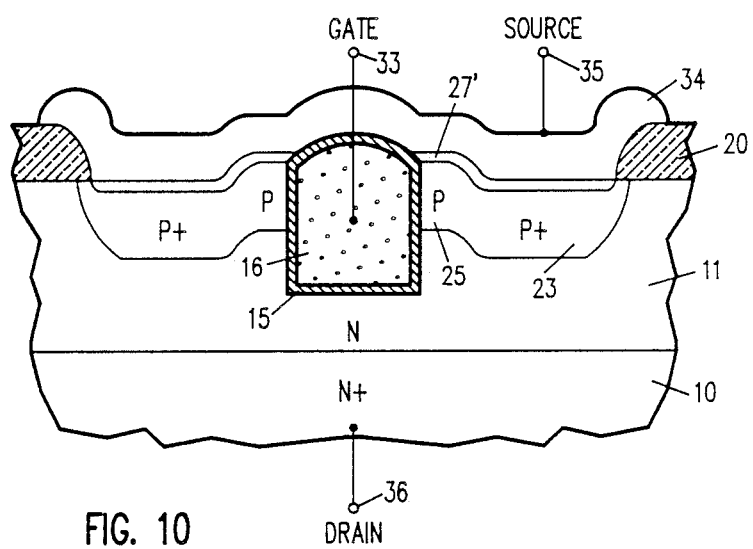
FIG. 10 is an alternative embodiment of the invention.

The structure of FIG. 8 may be modified, as shown in FIG. 10, so the refractory metal 27' contacts all of the deep P+ region 23. Here a satisfactory low resistance ohmic contact to this heavily doped region is formed.

The invention has been described and its operation detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A process for fabricating a vertical DMOS transistor, having source, drain, gate and body regions, comprising the steps:
    providing a high conductivity semiconductor substrate wafer having a first conductivity type and a similar conductivity type epitaxial layer thereon;
    forming an opposite conductivity type body region extending part way through said epitaxial layer;
    forming a heavily doped opposite conductivity type region surrounding said body region to define said DMOS transistor and to provide a deep body contact;
    forming a refractory metal layer over said body region to provide a contact thereto;
    forming a gate region within said body region by etching a trench in said epitaxial layer to completely penetrate said body region, forming a gate oxide on the walls of said trench, filling said trench with doped polysilicon and removing the excess polysilicon to leave said trench filled with conductive polysilicon to provide said gate electrode of said DMOS transistor; and
    forming contacts to said refractory metal, said conductive polysilicon, said deep body contact region and said substrate wafer,
    wherein said refractory metal acts as said source of said DMOS transistor, and
    wherein said refractory metal also forms an ohmic connection to said deep body contact region.

2. The process of claim 1 wherein said substrate wafer is composed of N+ silicon, said epitaxial layer is composed of N type silicon, said body region is composed of P type silicon and said deep body contact region is composed of P+ silicon.

3. The process of claim 1 wherein said substrate wafer is composed of P+ silicon, said epitaxial layer is composed of P type silicon, said body region is composed of N type silicon and said deep body contact region is composed of N+ silicon.

4. The process of claim 1 wherein said trench is formed by means of an anisotropic reactive ion etching step.

5. The process of claim 4 wherein said refractory metal is formed using a catalyzed metal deposition step in which the metal is deposited only upon an exposed silicon surface and wherein said refractory metal is employed as a mask for said anisotropic reactive ion etch.

* * * * *

UNITED STATES PATENT AND TRADEMARK OFFICE
CERTIFICATE OF CORRECTION

PATENT NO.    :   4,983,535
DATED         :   January 8, 1991
INVENTOR(S)   :   Richard A. Blanchard It is certified that error appears in the above-identified patent and that said Letters Patent is hereby corrected as shown below:

Column 1, line 50, after "transistor" insert --(disclosed in co-pending Ser. No. 06/843,484 by R. Blanchard)--.

Signed and Sealed this

Eighteenth Day of August, 1992

Attest:

DOUGLAS B. COMER

*Attesting Officer*   *Acting Commissioner of Patents and Trademarks*